United States Patent [19]
Choi

[11] Patent Number: 6,030,866
[45] Date of Patent: Feb. 29, 2000

[54] METHOD OF MANUFACTURING A CAPACITOR

[75] Inventor: Jong-Moon Choi, Seoul, Rep. of Korea

[73] Assignee: LG Semicon Co., Ltd., Chungcheongbuk-do, Rep. of Korea

[21] Appl. No.: 08/859,689

[22] Filed: May 21, 1997

[30] Foreign Application Priority Data

Nov. 4, 1996 [KR] Rep. of Korea ........................ 96-51807

[51] Int. Cl.[7] .................................................. H01L 21/8242
[52] U.S. Cl. ........................................................... 438/253
[58] Field of Search .................................. 438/238–256, 438/381–399

[56] References Cited

U.S. PATENT DOCUMENTS 5,160,762  11/1992  Brand et al. .
5,447,881   9/1995  Ryou .
5,496,757   3/1996  Rosner .
5,691,227  11/1997  Kim .
5,700,709  12/1997  Park et al. .

Primary Examiner—Jey Tsai

[57] ABSTRACT

A capacitor and a method of manufacturing a capacitor which includes the steps of sequentially forming an insulating layer and an etch stop layer over a semiconductor substrate; selectively etching the etch stop layer and the insulating layer to form a contact hole; forming a plug within the contact hole; forming a pillar on the etch stop layer adjacent to the plug and on the plug; forming a dielectric layer at the sides of the pillar; removing the pillar and forming a conductive layer over the dielectric layer; and forming an insulating layer over the conductive layer and etching the insulating layer and the conductive layer to expose the upper portion of the dielectric layer.

7 Claims, 5 Drawing Sheets

METHOD OF MANUFACTURING A CAPACITOR

BACKGROUND OF THE INVENTION

1. Field of the Invention

The present invention relates to capacitors of a semiconductor device and to a manufacturing method thereof, and more particularly to capacitors with a dielectric made of ferroelectric materials for increasing the capacitance thereof. The present invention is also concerned with a method of manufacturing the capacitors.

2. Discussion of Related Art

With the higher integration and use of semiconductor devices, research has focused on increasing the capacitance density of a capacitor so as to maintain the capacitance of such capacitors at an acceptable value regardless of the reduction in the cell size. In order to increase the capacitance of the capacitor, a stacked capacitor or a trench capacitor has been used since it can provide a dielectric with a large surface area. However, there still remains the problem that the increase of the surface area of the dielectric is limited due to the complicated manufacturing process of the stacked capacitor or the trench capacitor.

Therefore, it has been proposed to increase the capacitance of the capacitor by making the dielectric with a ferroelectric material, such as $Ta_2O_5$, $PZT(Pb(Zr Ti)O_3)$, or $BST((Ba Sr)TiO_3)$.

FIGS. 1(A) to 1(D) are diagrams showing the manufacturing process of a capacitor according to the prior art.

Referring to FIG. 1(A), a transistor is formed within an active region limited by a filled oxide layer 13 on a semiconductor substrate 11. The transistor includes a gate electrode 19 and source and drain regions 15 and 17. A bit line 23 is formed to be in contact with the drain region 17. An insulating layer 21 is formed over the whole surface of the resultant structure, and an insulating layer 25 made of silicon oxide is formed over the insulating layer 21.

After the formation of an etch stop layer 27 over the insulating layer 25, a predetermined portion of the etch stop layer 27 and insulating layers 25 and 21 are removed by photolithography, thus forming a contact hole 29 to expose the source region 15.

Referring to FIG. 1(B), a first conductive layer 31 is formed on the etch stop layer 27 and is in contact with the source region 15 by filling the contact hole 29. The first conductive layer 31 is formed by thickly depositing polycrystalline silicon doped with impurities using the Chemical Vapor Deposition method (hereinafter referred to as "CVD"). After deposition of a silicon oxide layer over the first conductive layer 31, the silicon oxide is patterned to form a mask pattern 33 corresponding to the contact holes 29. Thereafter, silicon nitride is deposited over the first conductive layer 31 and the mask pattern 33 using CVD and then is etched to form a side wall 35 at the sides of the mask pattern 33.

Referring to FIG. 1(C), the first conductive layer 31 is etched to expose the etch stop layer 27 by using the mask pattern 33 and side wall 35 as a mask. Thereafter, the remaining first conductive layer 31 is exposed by removing the mask pattern 33, and the exposed first conductive layer 31 is etched to a predetermined thickness by using the side wall 35 as a mask. In this case, the etch stop layer 27 serves to prevent the insulating layer 25 from being removed while removing the mask pattern 33. Thereafter, the remaining side wall 35 over the first conductive layer 31 is removed. At this time, the exposed portion of the etch stop layer 27 is also removed. The remaining first conductive layer 31 becomes a storage electrode.

Referring to FIG. 1(D), the ferroelectric material, such as for example, $Ta_2O_5$, $PZT(Pb(Zr Ti)O_3)$, or $BST((Ba Sr)TiO_3)$ is deposited over the surface of the first conductive layer 31 and is then thermally processed, thus forming a dielectric layer 37. Thereafter, polycrystalline silicon doped with impurities is deposited over the dielectric layer 37, thus forming a second conductive layer 39 which is used as a plate electrode.

However, the conventional capacitor manufacturing method as described above has the problem that the surface of the first conductive layer used as a storage electrode is oxidized by the oxygen constituting the dielectric layer and thus the dielectric layer becomes thick, reducing its capacitance. An additional problem is that the planarization of the second conductive layer deteriorates due to the first conductive layer.

SUMMARY OF THE INVENTION

Accordingly, the present invention is directed to a capacitor and a manufacturing method thereof which substantially obviates one or more of the problems due to limitations and disadvantages of the related art.

Thus, an object of the present invention is to provide a capacitor which can enhance planarization.

Another object of the present invention is to provide a method for a manufacturing a capacitor which can prevent a reduction in the capacitance due to an increase in the thickness of the dielectric layer, by preventing the oxidation of the storage electrode.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

To achieve these and other advantages and in accordance with the purpose of the present invention, as embodied and broadly described, the capacitor of the present invention comprises an insulating layer formed over a semiconductor substrate provided with a contact hole; a plug which fills the contact hole; a dielectric layer vertically formed around the contact hole; a first electrode electrically connected to the plug and formed to be in contact with a first side of the dielectric layer; and a second electrode formed to be in contact with a second side of the dielectric layer.

In another aspect, the present invention provides a method of manufacturing a capacitor which comprises the steps of sequentially forming an insulating layer and an etch stop layer over a semiconductor substrate; selectively etching the etch stop layer and the insulating layer and thus forming a contact hole; forming a plug within the contact hole; forming a pillar on the etch stop layer adjacent to the plug and on the plug; forming a dielectric layer at the sides of the pillar; removing the pillar and forming a conductive layer over the dielectric layer; and forming an insulating layer over the conductive layer and etching the insulating layer and the conductive layer to expose the upper portion of the dielectric layer.

It is to be understood that both the foregoing general description and the following detailed description are exemplary and explanatory and are intended to provide further explanation of the invention as claimed.

BRIEF DESCRIPTION OF THE ATTACHED DRAWINGS

The present invention will become more fully understood from the detailed description given hereinbelow and the accompanying drawings which are given by way of illustration only, and thus, are not limitative of the present invention, and wherein:

FIGS. 1(A) to 1(D) are diagrams showing the manufacturing process of a capacitor according to the prior art;

FIG. 2 is a cross sectional view showing a capacitor according to the present invention; and FIGS. 3(A) to 3(E) are diagrams showing the method of manufacturing the capacitor according to the present invention.

DETAILED DESCRIPTION OF PREFERRED EMBODIMENT

Reference will now be made in detail to the preferred embodiments of the present invention, examples of which are illustrated in the accompanying drawings.

Figure 1A:
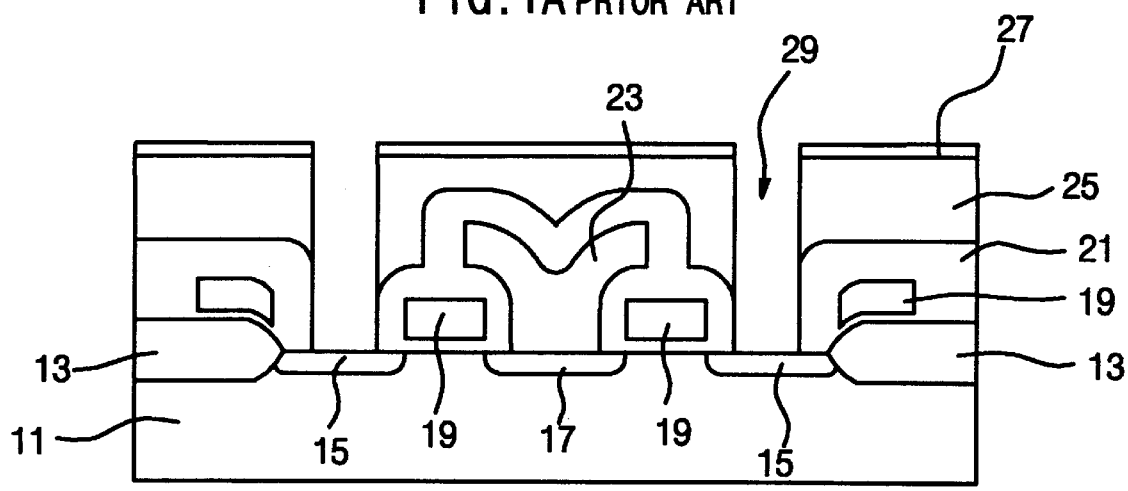
Figure 1B:
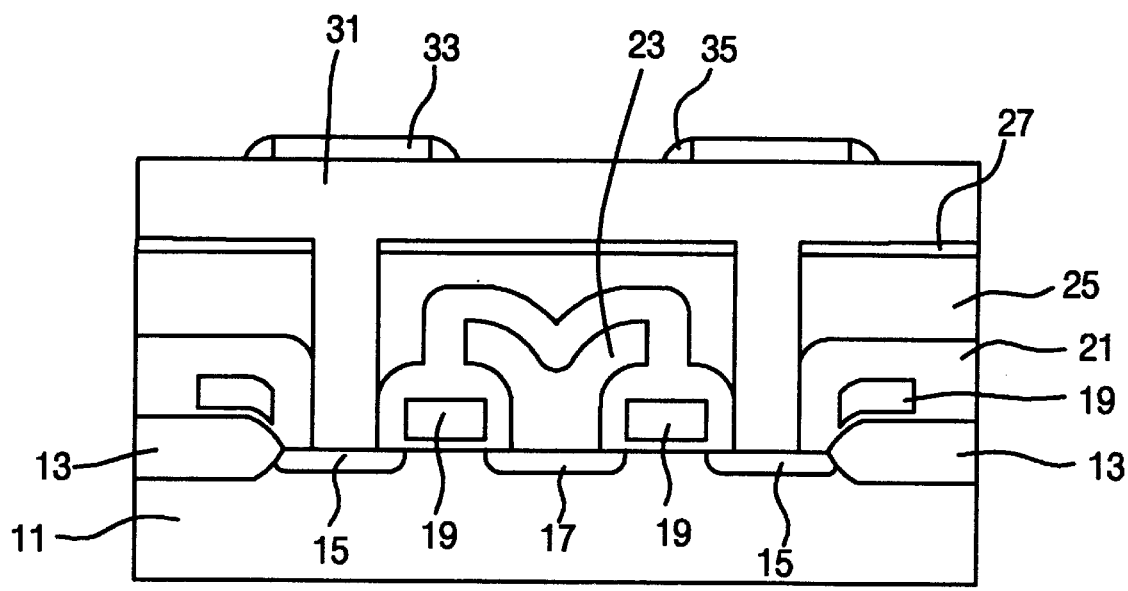
Figure 1C:
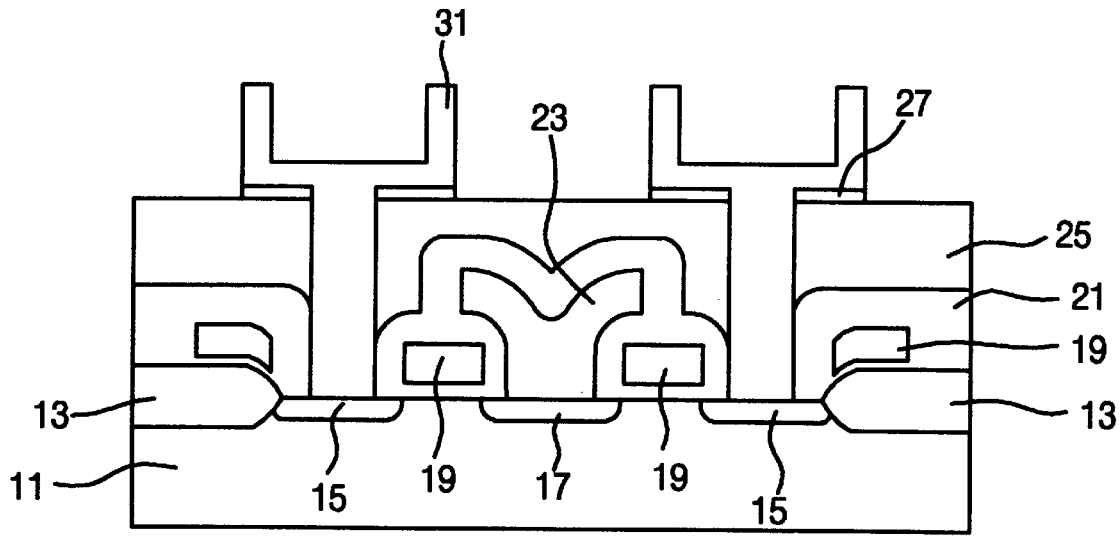
Figure 1D:
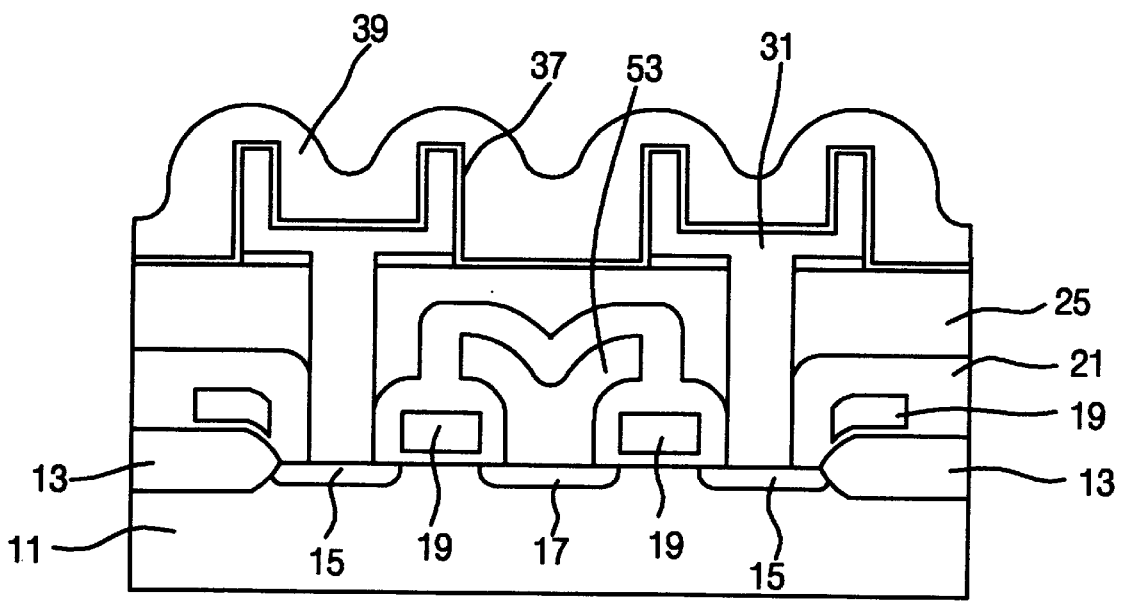
Figure 2:
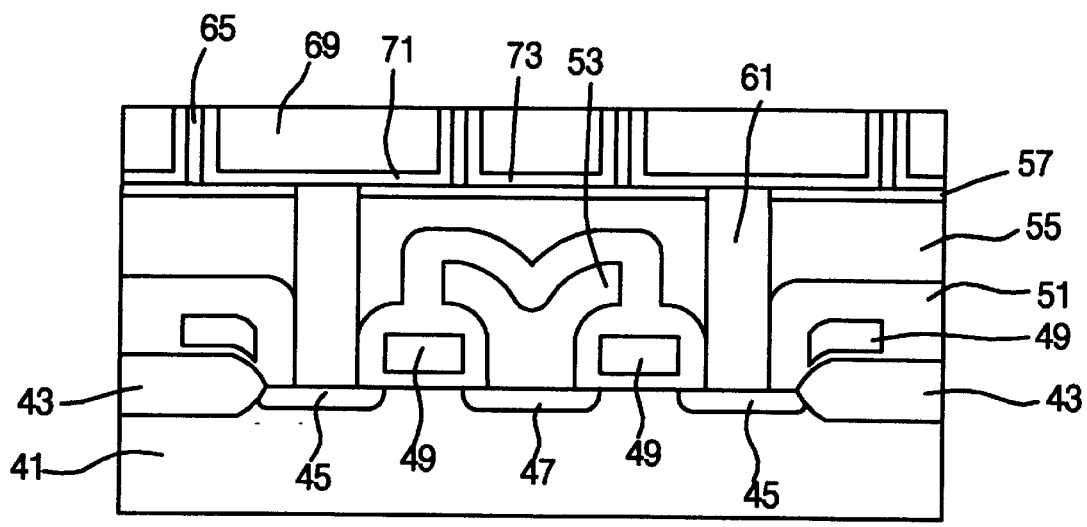

Referring to FIG. 2, a capacitor is formed over a semiconductor substrate 41, e.g. a silicon or titanium, where a transistor is formed within an active region limited by a filled oxide layer 43, e.g. $SiO_2$. The transistor includes a gate electrode 49, e.g. polysi, polycide, a metal gate such as tungsten, and source and drain regions 45 and 47. A bit line 53 is formed to be in contact with the drain region 47. An insulating layer 51, e.g. $SiO_2$, is formed over the whole surface of the resultant structure and an insulating layer 55 and an etch stop layer 57 are sequentially deposited over the insulating layer 51 using CVD. In this case, the insulating layer 55 is formed by a silicon oxide deposition and the etch stop layer 57 is formed by a silicon nitride deposition. Predetermined portions of the etch stop layer 57 and insulating layers 55 and 51 are selectively removed by a photolithography process, thus forming a contact hole 59 which exposes the source region 45.

A plug 61 is formed within the contact hole 59 to be electrically connected to the source region 45. The plug 61 is formed to fill the contact hole 59 with polycrystalline silicon doped with impurities, e.g. P and As, or with a conductive material, such as for example, tungsten (W), nickel (Ni), or palladium (Pd).

A first electrode 71 of a cylinder type used as a storage electrode is formed on the etch stop layer 57 around the plug 61 to be in electrical contact with the plug 61. A dielectric layer 65 which is made of ferroelectric material, such as $Ta_2O_5$, PZT(Pb(Zr Ti)$O_3$), or BST((Ba Sr)TiO$_3$) and has a first side in contact with the first electrode 71 is formed at an outer side wall of the first electrode 71. Over the exposed etch stop layer 57 where the first electrode 71 is not formed, a second electrode 73 of a cylinder type is formed which is used as a plate electrode and has an outer side wall which is in contact with a second side of the dielectric layer 65. In this case, the first and second electrodes 71 and 73 are formed with conductive material, such as tungsten (W), nickel (Ni), palladium (Pd) or titanium nitride (TiN) and are electrically isolated. Thereafter, an insulating layer 69, e.g. $SiO_2$, PSG, BPSG, USG, etc., is formed over the first and second electrodes 71 and 73. The insulating layer 69 is formed by depositing silicon oxide over the first and second electrodes 71 and 73 and then polishing the silicon oxide with a chemical-mechanical polishing process to expose the top of the dielectric layer 65 as a planar surface.

FIGS. 3(A) to 3(E) are diagrams showing the method of manufacturing the capacitor according to the present invention.

Figure 3A:
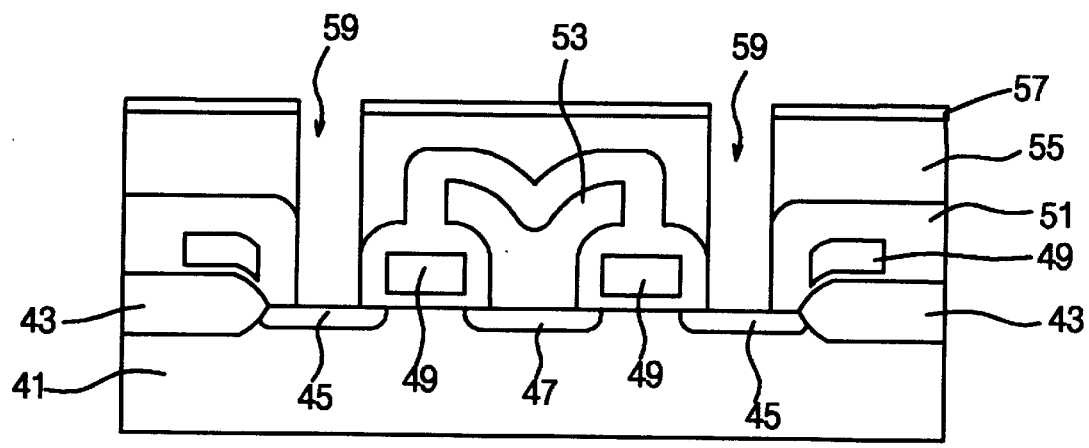

Referring to FIG. 3(A), the transistor is formed within the active region limited by the filled oxide layer 43 over the semiconductor substrate 41. The transistor includes the gate electrode 49 and source and drain regions 45 and 47. The bit line 53 is formed to be in contact with the drain region 47. The insulating layer 51 is formed over the whole surface of this structure and the insulating layer 55 and the etch stop layer 57 are sequentially deposited over the insulating layer 51 using CVD. In this case, the insulating layer 55 is silicon oxide and the etch stop layer 57 is silicon nitride. A predetermined portion of the etch stop layer 57 and the insulating layers 55 and 51 is removed by the photolithography process, thus forming the contact hole 59 to expose the source region 45.

Figure 3B:
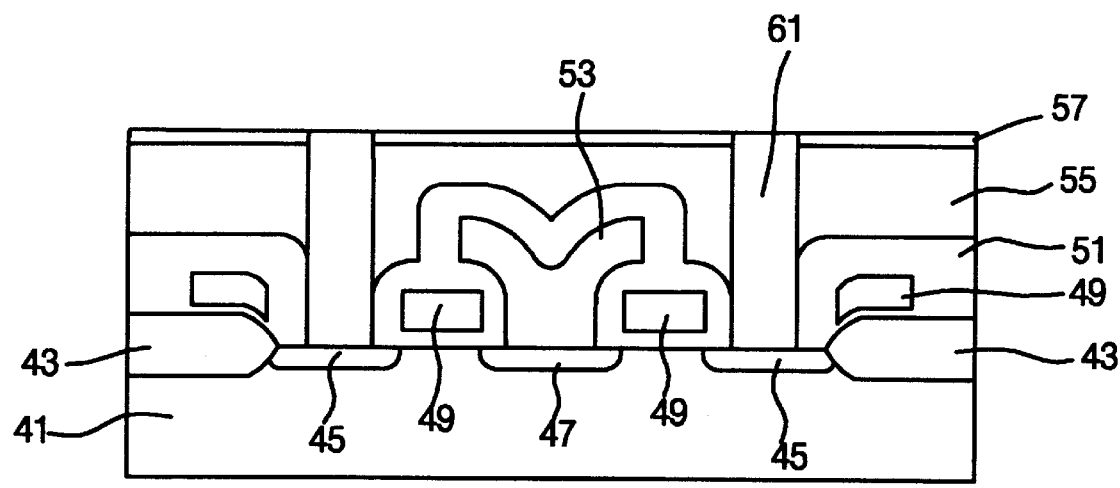

Referring to FIG. 3(B), the plug 61 is formed within the contact hole 59 to be in electrical contact with the source region 45. The plug 61 is formed by depositing a compound of polycrystalline silicon doped with impurities or a conductive material, such as tungsten (W), nickel (Ni), or palladium (Pd) over the etch stop layer 57 using CVD to fill the contact hole 59 so as to be in contact with the source region 45 and then etching the polycrystalline silicon composite to expose the etch stop layer 57.

Figure 3C:
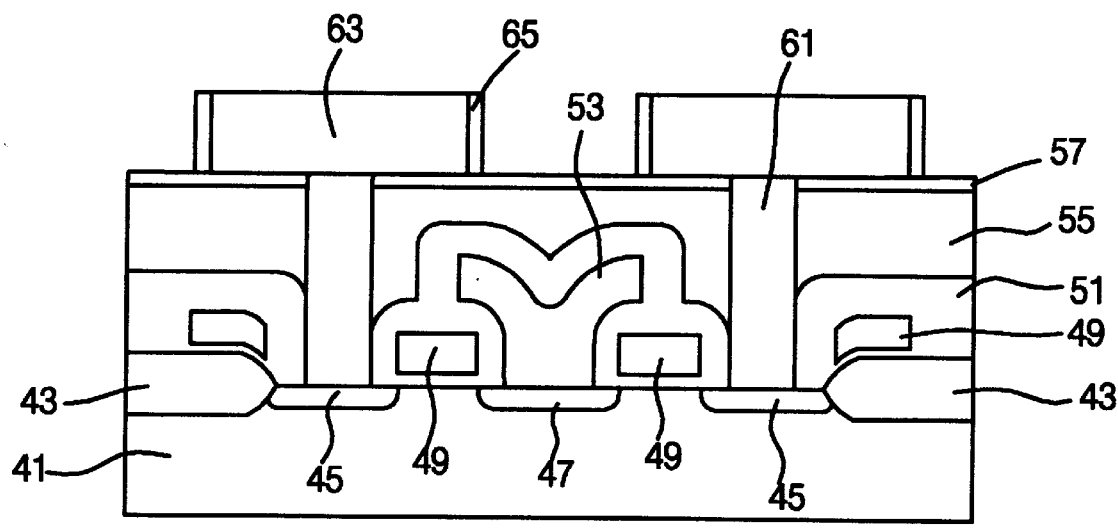

Referring to FIG. 3(C), silicon oxide is deposited over the etch stop layer 57 and the plug 61 using CVD, and then is patterned using photolithography process using the node mask, thus forming a pillar 63, e.g. SiO, $SiO_2$, PSG, BPSG, USG, etc., at that portion corresponding to the plug 61. A dielectric layer 65 is formed by depositing a ferroelectric material, such as $Ta_2O_5$, PZT(Pb(Zr Ti)$O_3$), or BST((Ba Sr)TiO$_3$) over the surface of the etch stop layer 57 and the pillar 63, after which it is stabilized by thermal processing. Thereafter, the dielectric layer 65 is etched to expose the upper surface of the etch stop layer 57 and the pillar 63 so that the dielectric layer 65 remains only at the sides of the pillar 63 in a sidewall form.

Figure 3D:
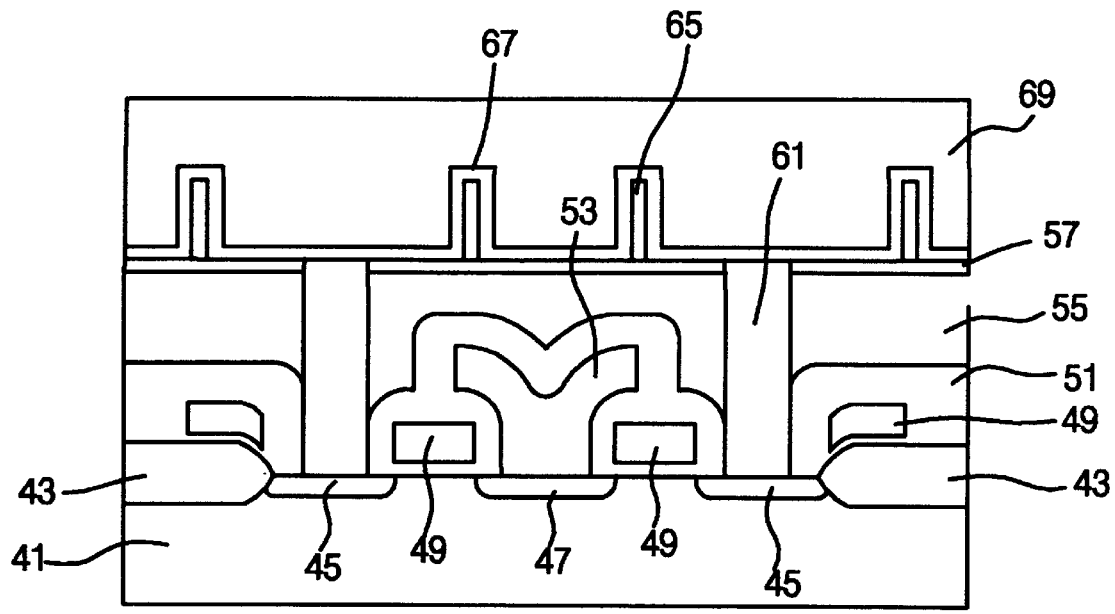

Referring now to FIG. 3(D), the pillar 63 is removed with an HF etch. In this case, since the silicon oxide pillar 63 has a high etch selection rate relative to the dielectric layer 65, the dielectric layer 65 is not etched but only the pillar 63 is removed. Thereafter, a metal layer 67 is formed by depositing a conductive metal, such as a tungsten (W), a nickel (Ni), a palladium (Pd) or titanium nitride (TiN) over the surface of the etch stop layer 57, plug 61 and dielectric layer 65. At this time, since the dielectric layer 65 is in a stable state, the contact portion of the metal layer 67 is not oxidized by the oxygen constituting the dielectric layer 65. In addition, the metal layer 67 is electrically connected to the plug 61. Thereafter, silicon oxide is deposited over the metal layer 67 by CVD, thus forming the insulating layer 69.

Figure 3E:
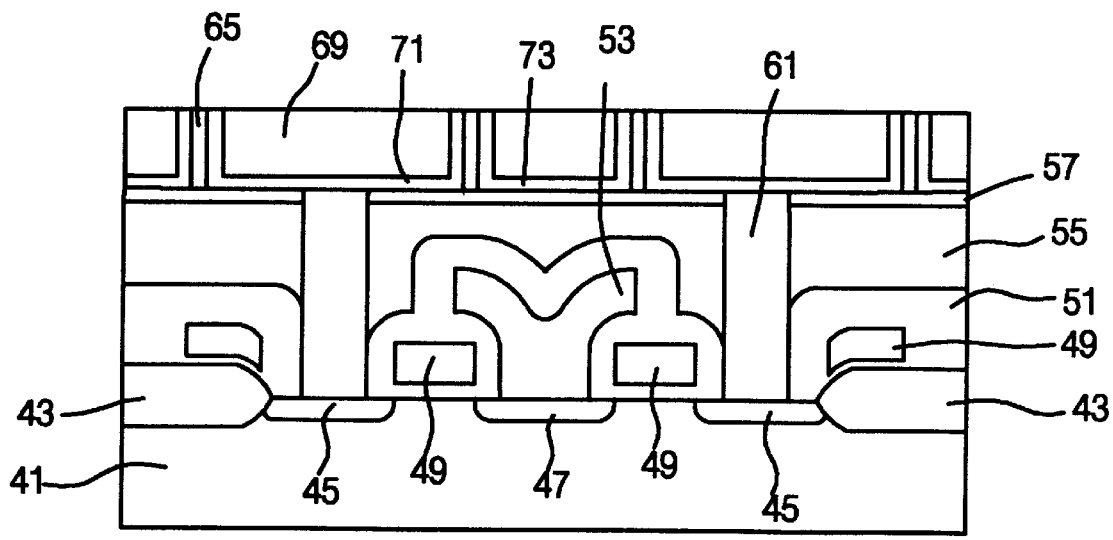

Referring to FIG. 3(E), the insulating layer 69 and the metal layer 67 are sequentially polished and removed by a chemical-mechanical polishing process to expose the upper portion of the dielectric layer 65. In this case, the surface of the insulating layer 69 becomes planar within the dielectric layer 65 and metal layer 67, and the metal layer 67 is separated into a portion connected to the plug 61 and a portion separated by the dielectric layer 65, and thus not connected to the plug 61. The portion connected to the plug 61 is the first electrode 71 used as the storage electrode and the portion not connected to the plug 61 is the second electrode 73 used as the plate electrode.

As described above, in the manufacturing method of the capacitor according to the present invention, since the metal layer for forming the electrodes is formed to be in contact with the dielectric layer after forming and stabilizing the dielectric layer around the plug in the contact hole which exposes the source region of the transistor formed over the semiconductor substrate, it is possible to prevent the contact portion of the metal layer from being oxidized. In addition, with the sequential polishing of the insulating layer over the metal layer and the metal layer to expose the upper portion of the dielectric layer, the metal layer is separated into the first electrode used as the storage electrode and the second electrode used as the plate electrode and the insulating layer becomes planar therewith.

The present invention thus prevents a reduction of the capacitance due to an increase in the thickness of the dielectric layer and an enhanced planarization of the surface of the insulating layer with the metal layers and the dielectric layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a capacitor comprising the steps of:

providing a semiconductor substrate, sequentially forming at least one insulating layer and an etch stop layer over the semiconductor substrate;

selectively etching said etch stop layer and said insulating layer to form at least one contact hole therein;

forming a plug within said contact hole;

forming an insulating pillar on said plug and on the etch stop layer disposed adjacent to said plug;

forming a dielectric layer on the sides of said pillar;

removing said pillar and forming a conductive layer over said dielectric layer and the surface of said etch stop layer and said plug; and forming an insulating layer over said conductive layer and etching said insulating layer and said conductive layer to expose an upper portion of said dielectric layer to form a planar surface of the insulating layer with the conductive layer and the dielectric layer.

2. The method of claim 1, wherein said plug is formed with a conductive metal, selected from the group consisting of tungsten, nickel, and palladium.

3. The method of claim 1, wherein said pillar is formed by depositing silicon oxide over the etch stop layer and the plug and patterning the silicon oxide by a photolithography method using a node mask.

4. The method of claim 1, wherein the dielectric layer is formed with a ferroelectric material selected from the group consisting of $Ta_2O_5$, PZT(Pb(Zr Ti)$O_3$), and BST ((BA Sr)$TiO_3$).

5. The method of claim 4, wherein said dielectric layer is formed by depositing said ferroelectric material over the surface of the etch stop layer including said pillar and etching said ferroelectric material to expose said etch stop layer and the upper surface of said pillar.

6. The method of claim 1, wherein the insulating layer disposed on said conductive layer and said conductive layer are polished using a chemical-mechanical polishing process.

7. The method of claim 1, wherein the etching of the insulating layer and the conductive layer separates the conductive layer into a first portion which is in contact with a first side of said dielectric layer and a second portion which is in contact with a second side thereof, thereby forming first and second electrodes.

* * * * *